(12) United States Patent
Christensen et al.

(10) Patent No.: US 10,447,054 B2
(45) Date of Patent: Oct. 15, 2019

(54) STAIRCASE CHARGING

(71) Applicant: Robert Bosch GmbH, Stuttgart (DE)

(72) Inventors: John F. Christensen, Elk Grove, CA (US); Reinhardt Klein, Mountain View, CA (US); Ashish Krupadanam, Cupertino, CA (US); Anahita MirTabatabaei, San Francisco, CA (US); Nikhil Ravi, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 566 days.

(21) Appl. No.: 15/160,659

(22) Filed: May 20, 2016

(65) Prior Publication Data

US 2017/0338666 A1 Nov. 23, 2017

(51) Int. Cl.
| | |
|---|---|
| *H01M 10/44* | (2006.01) |
| *H01M 10/46* | (2006.01) |
| *H02J 7/00* | (2006.01) |
| *G01R 31/36* | (2019.01) |
| *H01M 10/42* | (2006.01) |
| *H01M 10/48* | (2006.01) |

(52) U.S. Cl.
CPC .......... *H02J 7/007* (2013.01); *G01R 31/3651* (2013.01); *G01R 31/3679* (2013.01); *H01M 10/425* (2013.01); *H01M 10/441* (2013.01); *H01M 10/48* (2013.01); *H02J 7/0021* (2013.01); *H01M 2010/4271* (2013.01)

(58) Field of Classification Search
CPC .... H02J 7/04; H02J 7/042; H02J 7/045; H02J 7/0093; H02J 7/0077; H02J 7/0081; H02J 7/0083

USPC ................. 320/124, 125, 152, 160
See application file for complete search history.

(56) References Cited

U.S. PATENT DOCUMENTS

| | | | |
|---|---|---|---|
| 5,828,202 | A | 10/1998 | Tamai |
| 5,905,364 | A | 5/1999 | Ookita |

(Continued)

FOREIGN PATENT DOCUMENTS

| | | |
|---|---|---|
| CN | 101355261 | 1/2009 |
| CN | 104269583 | 1/2015 |

(Continued)

OTHER PUBLICATIONS

Google translation of CN 104269583 (Jul. 2015).*

(Continued)

*Primary Examiner* — Edward Tso
(74) *Attorney, Agent, or Firm* — Michael Best & Friedrich LLP

(57) ABSTRACT

A battery management system comprising a processor and a memory storing instructions that, when executed by the processor, cause the battery management system to estimate one or more states of the battery by applying a battery model to account for physical parameters of a chemical composition of the battery based on one or more measured characteristics of the battery and the one or more estimated characteristics of the battery and regulate a first charging mode of the battery based on the estimation of the one or more states of the one or more battery cells and switch between the first charging mode and a second charging mode based on the estimation of the one or more states of the battery to allow for rapid charging of the battery.

20 Claims, 11 Drawing Sheets

(56) References Cited

U.S. PATENT DOCUMENTS

| | | | |
|---|---|---|---|
| 8,901,885 B2 | 12/2014 | Kelty et al. | |
| 2011/0199054 A1 | 8/2011 | Burchardt et al. | |
| 2011/0267009 A1 | 11/2011 | Nakatsuji et al. | |
| 2017/0288414 A1* | 10/2017 | Klein | H01M 10/425 |

FOREIGN PATENT DOCUMENTS

| | | |
|---|---|---|
| CN | 105048014 | 11/2015 |
| EP | 2846395 A2 | 3/2015 |
| WO | 2008154956 | 12/2008 |
| WO | 2008154960 | 12/2008 |
| WO | 2014012394 | 1/2014 |

OTHER PUBLICATIONS

Fuller et al., "Simulation and Optimization of the Dual Lithium Ion Insertion Cell," J. Electrochem. Soc., vol. 141, No. 1, Jan. 1994, pp. 1-10.

Mayhew et al., "Investigation of projection-based model-reduction techniques for solid-phase diffusion in Li-ion batteries," American Control Conference (ACC), 2014, pp. 123-128, Jun. 4-6, 2014.

Schalkwijk, W. A. v., "Charging, Monitoring, and Control," in Advances in Lithium-ion Batteries, W. A. v. Schalkwijk and B. Scrosati, Eds. Kluwer Academic: New York, 2002; pp. 459-480.

Li, J., E. Murphy, J. Winnick, and P. A. Kohl, "The effects of pulse charging on cycling characteristics of commercial lithium-ion batteries," Journal of Power Sources, 102 (2001) 302-309.

Purushothaman, B. K. and U. Landau, "Rapid Charging of Lithium-ion Batteries Using Pulsed Currents: A Theoretical Analysis," Journal of the Electrochemical Society, 153 (2006) A533-A542.

Doyle, M., T. F. Fuller, and J. Newman, "Modeling of Galvanostatic Charge and Discharge of the Lithium Polymer Insertion Cell," Journal of the Electrochemical Society, 140 (1993); pp. 1526-1533.

Doyle, M., T. F. Fuller, and J. Newman, "The Importance of the Lithium Ion Transference Number in Lithium/Polymer Cells," Electrochimica Acta, 39 (1994) 2073-2081.

Doyle, C. M. "Design and simulation of lithium rechargeable batteries." Dissertation, University of California, Berkeley, Berkeley, 1995.

Darling, R. and J. Newman, "Modeling side reactions in composite LiyMn2O4 electrodes," Journal of the Electrochemical Society, 145 (1998) 990-998.

Doyle, M., J. Newman, A. S. Gozdz, C. N. Scmutz, and J. M. Tarascon, "Comparison of Modeling Predictions with Experimental Data from Plastic Lithium Ion Cells," Journal of the Electrochemical Society, 143 (1996) 1890-1903.

Arora, P., M. Doyle, and R. E. White, "Mathematical Modeling of the Lithium Deposition Overcharge Reaction in Lithium-ion Batteries Using Carbon-based Negative Electrodes," Journal of the Electrochemical Society, 146 (1999) 3543-3553.

Thomas, K. E., R. M. Darling, and J. Newman, "Mathematical Modeling of Lithium Batteries," in Advances in Lithium-on Batteries, W. A. v. Schalkwijk and B. Scrosati, Eds. Kluwer Academic: New York, 2002; pp. 345-392.

\* cited by examiner

STAIRCASE CHARGING

STATEMENT REGARDING FEDERALLY SPONSORED RESEARCH

This invention was made with government support under ARPA-E Award No. DE-AR0000278 awarded by the U.S. Department of Energy. The U.S. government has certain rights in the invention.

FIELD

The invention generally relates to secondary batteries, and more particularly to a method of rapidly charging a secondary battery.

BACKGROUND

Rechargeable lithium batteries are attractive energy storage devices for portable electric and electronic devices and electric and hybrid-electric vehicles because of their high specific energy compared to other electrochemical energy storage devices. A typical lithium cell contains a negative electrode, a positive electrode, and a separator located between the negative and positive electrodes. Both electrodes contain active materials that react with lithium reversibly. In some cases, the negative electrode may include lithium metal, which can be electrochemically dissolved and deposited reversibly. The separator contains an electrolyte with a lithium cation, and serves as a physical barrier between the electrodes such that none of the electrodes are electrically connected within the cell.

Typically, during charging, there is generation of electrons at the positive electrode and consumption of an equal amount of electrons at the negative electrode. During discharging, opposite reactions occur.

Applications that use rechargeable batteries as a power source generally become more attractive to consumers if the battery can be charged very rapidly. The charge rate is often limited by the intrinsic kinetic and transport properties of the materials of which the battery is composed. Too high a recharge rate can cause degradation of the materials or increase the driving force for deleterious side reactions. Batteries without intrinsic overcharge protection (e.g. lithium-ion batteries) may be susceptible to degradation when charged at high rates to high states of charge.

The conventional method for charging batteries is a constant-current constant-voltage (CCCV) technique, often called a taper-charge technique. During a taper charge the battery is charged at a constant current until it reaches a cutoff voltage, at which point it is charged potentiostatically at that voltage, with the current tapering toward zero. Although a significant portion of the battery's charge can be attained during the constant current step, it takes a much longer time to approach full charge because the average current during the constant voltage step is low. Thus, there is a need for a method of charging a battery to high states of charge which allows for rapid charging while minimizing or eliminating the potential deleterious effects of rapid charging.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure are related to systems and methods for estimating the states and parameters of a battery and regulating the rapid charging of the battery based on the estimated states and parameters.

One embodiment includes a method of managing a battery system, the battery system including one or more battery cells, one or more sensors coupled to the one or more battery cells and configured to measure one or more characteristics of the one or more battery cells, and a battery management system coupled to the one or more sensors and including a microprocessor and a memory. The battery management system receives one or more measured characteristics of the one or more battery cells from the one or more sensors and receives one or more estimated characteristics of the one or more battery cells. The battery management system then estimates one or more states of the one or more battery cells by applying a battery model to account for physical parameters of a chemical composition of the one or more battery cells based on the one or more measured characteristics of the battery and the one or more estimated characteristics of the battery. The battery management system regulates the charging of the one or more battery cells in a first charging mode of the battery based on the estimation of the one or more states of the one or more battery cells, and switches between the first charging mode and a second charging mode based on the estimation of the one or more states of the one or more battery cells, wherein the second charging mode is different from the first charging mode.

Another embodiment includes a battery management system comprising a processor and a memory storing instructions that, when executed by the processor, cause the battery management system to receive one or more measured characteristics of one or more battery cells from one or more sensors, wherein the one or more battery cells and the one or more sensors are part of a battery system, and to receive one or more estimated characteristics of the one or more battery cells from a battery model. The battery management system then estimates one or more states of the one or more battery cells by applying a battery model to account for physical parameters of a chemical composition of the one or more battery cells based on the one or more measured characteristics of the battery and the one or more estimated characteristics of the battery. The battery management system regulates a first charging mode of the battery based on the estimation of the one or more states of the one or more battery cells, and switches between the first charging mode and a second charging mode based on the estimation of the one or more states of the one or more battery cells, wherein the second charging mode is different from the first charging mode.

The details of one or more features, aspects, implementations, and advantages of this disclosure are set forth in the accompanying drawings, the detailed description, and the claims below.

DETAILED DESCRIPTION

One or more specific embodiments will be described below. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Figure 1:
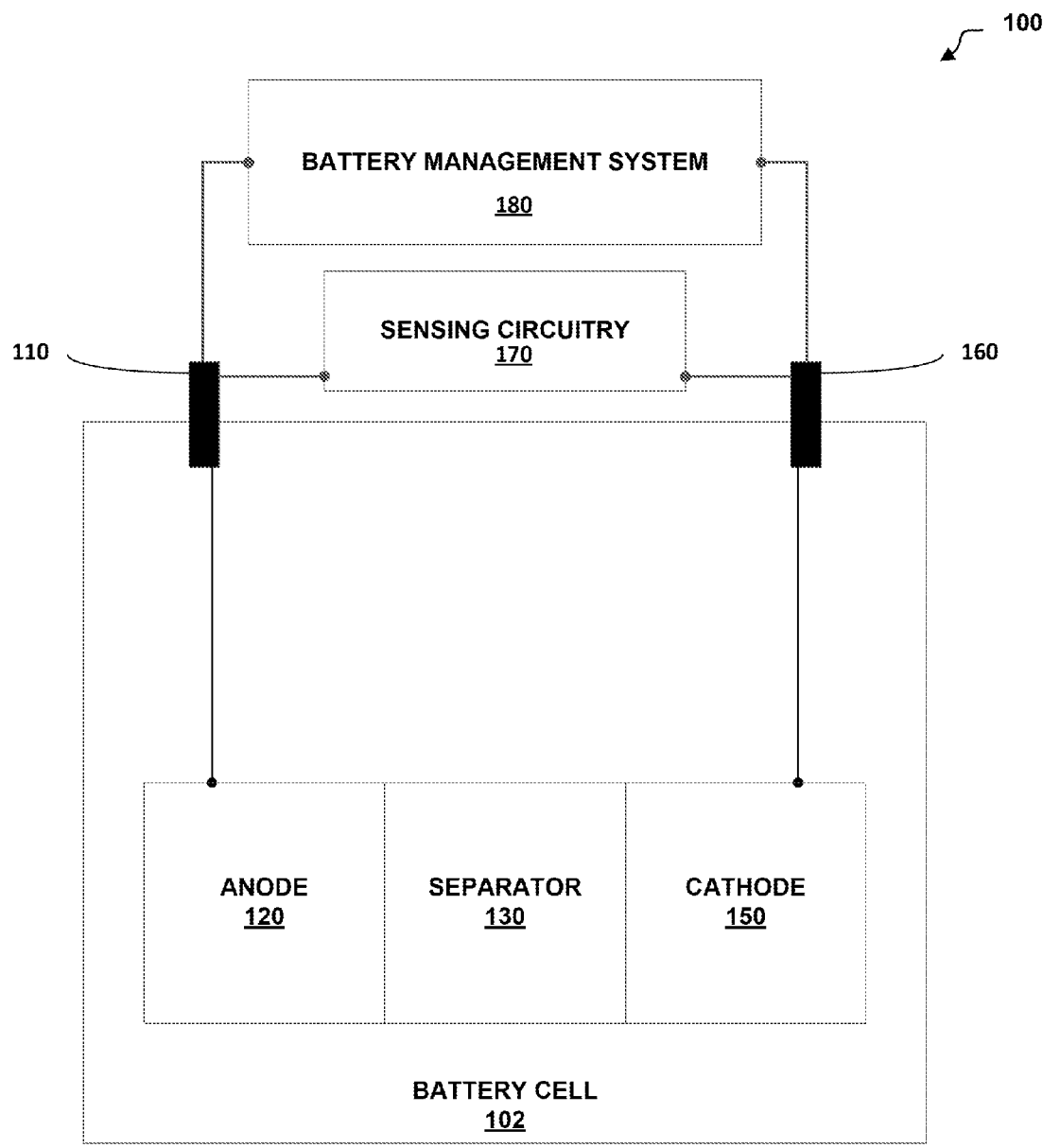
FIG. 1 is a block diagram of a battery system including a battery cell and a battery management system with sensing circuitry incorporated into the battery cell, in accordance with some embodiments.

An embodiment of a battery system 100 is shown in FIG. 1. The battery system 100 includes an anode tab 110, an anode 120, a separator 130, a cathode 150, a cathode tab 160, a sensing circuitry 170, and a battery management system 180. In some examples, the separator 130 may be an electrically insulating separator. In some embodiments, the electrically insulating separator includes a porous polymeric film. In some embodiments, the thickness of the anode 120 may be about 25 micrometers to about 150 micrometers. In other embodiments, the thickness of the anode 120 may be outside of the previous range. In some embodiments, the thickness of the separator 130 may be about 10 micrometers to about 25 micrometers. In other embodiments, the thickness of the separator 130 may be outside of the previous range. In some embodiments, the thickness of the cathode 150 may be about 10 micrometers to about 150 micrometers. In other embodiments, the thickness of the cathode 150 may outside the previous range.

During the discharge of the battery cell 102, lithium is oxidized at the anode 120 to form a lithium ion. The lithium ion migrates through the separator 130 of the battery cell 102 to the cathode 150. During charging the lithium ions return to the anode 120 and are reduced to lithium. The lithium may be deposited as lithium metal on the anode 120 in the case of a lithium anode 120, or inserted into the host structure in the case of an insertion material anode 120, such as graphite. The process is repeated with subsequent charge and discharge cycles. In the case of the graphitic or other Li-insertion electrode, the lithium cations are combined with electrons and the host material (e.g., graphite), results in an increase in the degree of lithiation, or "state of charge" of the host material. For example, $xLi^+ + xe^- + C_6 \rightarrow Li_xC_6$.

The anode 120 may include an oxidizable metal, such as lithium or an insertion material that can insert Li or some other ion (e.g., Na, Mg, or other suitable ion). The cathode 150 may include various materials such as sulfur or sulfur-containing materials (e.g., polyacrylonitrile-sulfur composites (PAN-S composites), lithium sulfide ($Li_2S$)); vanadium oxides (e.g., vanadium pentoxide ($V_2O_5$)); metal fluorides (e.g., fluorides of titanium, vanadium, iron, cobalt, bismuth, copper and combinations thereof); lithium-intercalation materials (e.g., lithium nickel manganese cobalt oxide (NMC), lithium-rich NMC, lithium nickel manganese oxide ($LiNi_{0.5}Mn_{1.5}O_4$)); lithium transition metal oxides (e.g., lithium cobalt oxide ($LiCoO_2$), lithium manganese oxide ($LiMn_2O_4$), lithium nickel cobalt aluminum oxide (NCA), and combinations thereof); lithium phosphates (e.g., lithium iron phosphate ($LiFePO_4$)); additional materials that react with the working ion; and/or blends of several different materials that insert and/or react with the working ion.

The particles may further be suspended in a porous, electrically conductive matrix that includes polymeric binder and electronically conductive material such as carbon (carbon black, graphite, carbon fiber, etc.). In some examples, the cathode may include an electrically conductive material having a porosity of greater than 80% to allow the formation and deposition/storage of oxidation products such as lithium peroxide ($Li_2O_2$) or lithium sulfide, ($Li_2S$) in the cathode volume. The ability to deposit the oxidation product directly determines the maximum power obtainable from the battery cell. Materials which provide the needed porosity include carbon black, graphite, carbon fibers, carbon nanotubes, and other non-carbon materials. The pores of the cathode 150, separator 130, and anode 120 are filled with an ionically conductive electrolyte that includes a salt such as lithium hexafluorophosphate ($LiPF_6$) that provides the electrolyte with an adequate conductivity which reduces the internal electrical resistance of the battery cell. The electrolyte solution enhances ionic transport within the battery cell 102. Various types of electrolyte solutions are available, including non-aqueous liquid electrolytes, ionic liquids, solid polymers, glass-ceramic electrolytes, and other suitable electrolyte solutions.

The separator 130 may include one or more electrically insulating ionic conductive materials. In some examples, the suitable materials for separator 130 may include porous polymers filled with liquid electrolyte, ceramics, and/or ionically-conducting polymers. In certain examples, the pores of the separator 130 may be filled with an ionically conductive electrolyte that contains a lithium salt (for example, a lithium hexafluorophosphate ($LiPF_6$)) that provides the electrolyte with an adequate conductivity which reduces the internal electrical resistance of the battery cell.

The battery management system 180 is communicatively connected to the battery cell 102. In one example, the battery management system 180 is electrically connected to the battery cell 102 via electrical links (e.g., wires). In another example, the battery management system 180 may be wirelessly connected to the battery cell 102 via a wireless communication network. The battery management system 180 may include, for example, a microcontroller (the microcontroller having an electronic processor, memory, and input/output components on a single chip or within a single housing). Alternatively, the battery management system 180 may include separately configured components, for example, an electronic processor, memory, and input/output components. The battery management system 180 may also be implemented using other components or combinations of components including, for example, a digital signal processor (DSP), an application specific integrated circuit (ASIC), a field-programmable gate array (FPGA), or other circuitry. Depending on the desired configuration, the processor may include one or more levels of caching, such as a level cache memory, one or more processor cores, and registers. The example processor core may include an arithmetic logic unit (ALU), a floating point unit (FPU), or any combination thereof. The battery management system 180 may also include a user interface, a communication interface, and other computer implemented devices for performing features not defined herein may be incorporated into the system. In some examples, an interface bus for facilitating communication between various interface devices, computing implemented devices, and one or more peripheral interfaces to the microprocessor may be provided.

In the example of FIG. 1, a memory of the battery management system 180 stores computer-readable instructions that, when executed by the electronic processor of the battery management system 180, cause the battery management system 180 and, more particularly the electronic processor, to perform or control the performance of various functions or methods attributed to battery management system 180 herein (e.g., receive measured characteristics, receive estimated characteristics, calculate a state or parameter of the battery system, regulate the operation of the battery system). In an embodiment the battery management system 180 regulates the charging of the battery cell 102 by executing a plurality of stepwise charging modes which allow for rapid charging of the battery while minimizing deleterious effects. The memory may include any transitory, non-transitory, volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital or analog media. The functions attributed to the battery management system 180 herein may be embodied as software, firmware, hardware or any combination thereof.

In one example, the battery management system 180 may be embedded in a computing device and the sensing circuitry 170 is configured to communicate with the battery management system 180 of the computing device external to the battery cell 102. In this example, the sensing circuitry 170 is configured to have wireless and/or wired communication with the battery management system 180. For example, the sensing circuitry 170 and the battery management system 180 of the external device are configured to communicate with each other via a network. In yet another example, the battery management system 180 is remotely located on a server and the sensing circuitry 170 is configured to transmit data of the battery cell 102 to the battery management system 180. In the above examples, the battery management system 180 is configured to receive the data and send the data to the computing device for display as human readable format. The computing device may be a cellular phone, a tablet, a personal digital assistant (PDA), a laptop, a computer, a wearable device, or other suitable computing device. The network may be a cloud computing network, a server, a wireless area network (WAN), a local area network (LAN), an in-vehicle network, or other suitable network.

The battery management system 180 is configured to receive data from the sensing circuitry 170 including current, voltage, temperature, and/or resistance measurements. The battery management system 180 is also configured to determine a condition of the battery cell 102. Based on the determined condition of battery cell 102, the battery management system 180 may alter the operating parameters of the battery cell 102 to maintain the internal states (e.g., the internal states include an anode surface overpotential) of the battery cell 102 within predefined constraints, or constraints that are adapted to the estimated condition of the battery cell 102. The battery management system 180 may also notify a user of the condition of the battery cell 102.

Various models have been developed to model the electrochemical reactions occurring within the battery cell 102. One example, was developed by Fuller, Doyle, and Newman, (the Newman Model), (*J. Electrochem. Soc.*, Vol. 141, No. 1, January 1994, pp. 1-10), the contents of which are hereby incorporated by reference in their entirety. The Newman Model provides a mathematical model which can be used to estimate the electrochemical processes occurring within the battery cell 102 based on the measured characteristics.

The charge transfer reactions at the anode 120, and cathode 150, may be modelled by an electrochemical model, such as the Newman Model, providing the basis to describe various battery cell 102 parameters during both the charging and discharging of the battery cell 102. For example, the Newman Model may be employed in the estimation of various parameters including cathode particle radius, which can vary due to the degree of lithiation of the cathode 150, anode particle radius, ion diffusion coefficients in the anode 120, cathode 150, and electrolyte, intercalation exchange current density in either electrode, cation transference number and ionic conductivity in the electrolyte, porosity of the separator 130, anode 120, and cathode 150.

In addition, various internal states of the battery cell 102, corresponding to variable states of the Newman model, can be estimated using state estimation algorithms stored in the memory and executed by the processor. Depending on the application, the memory and the processor may be implemented/integrated in the battery management system or located remotely outside the battery management system. The battery management system 180 may continuously estimate internal states of the battery cell 102 (for example, the anode and cathode surface overpotential and internal temperature) during the charging of the battery cell 102. When the internal states of the battery cell 102 surpass a predefined threshold (e.g., anode surface overpotential <1 mV vs. Li/Li+ potential), the battery management system 180 controls the charging process by, for example, switching between two or more charging modes (e.g., substantially constant current and substantially constant voltage).

Physics based electrochemical models, such as the Newman Model, may include ordinary and partial differential equations (PDEs) to describe the behavior of the various parameters within the battery cell 102. The Newman Model is an electrochemical-based model of the actual chemical and electrical processes occurring in the Li-ion batteries. However, the full Newman Model is extremely complex and requires a large number of immeasurable physical parameters to be identified. Identification of such large set of parameters involved in the nonlinear PDE and differential algebraic equations (DAEs) with current computational capacity is often impractical. This gives rise to various electrochemical models that approximate the dynamics of the Newman Model.

For example, the Reduced-Order-Model (ROM), Mayhew, C.; Wei He; Kroener, C.; Klein, R.; Chaturvedi, N.; Kojic, A., "Investigation of projection-based model-reduction techniques for solid-phase diffusion in Li-ion batteries," American Control Conference (ACC), 2014, pp. 123-128, 4-6 Jun. 2014, the contents of which are hereby incorporated by reference in their entirety, allows the model order reduction of the Newman Model of Li-ion cells while retaining the complete model structure of the of the baseline cell. The ROM of the Newman Model is able to accurately predict behavior of a truth model, while reducing computation time and memory requirements. The Newman Model reduction by ROM, introduces a large number of states and parameters involved in highly nonlinear partial differential equations and differential algebraic equations of the ROM dynamical system. This contributes to the complexity of the parameter and state identification process.

In some embodiments non-electrochemical battery models (e.g., equivalent circuit model, single particle model) may be used to model the states and parameters of the battery cell 102. In a further embodiment both electrochemical and non-electrochemical models can be used in combination to describe the operation and condition of the battery cell 102.

Various methods can be used for state and parameter estimation (e.g., Extended Kalman Filter, Moving Horizon Estimation, Recursive Least Squares Estimation). The various estimation methods may be used alone or in combination to estimate the states and parameters of the battery cell 102.

An Extended Kalman Filter (EKF) describes the process model as a nonlinear time varying model in discrete time, but uses a local linearization at each time step. The set of outputs from the electrochemical model via the Extended Kalman Filter (EKF) can include estimation of both rapidly varying states of the battery cell 102 and estimation of slowly varying parameters of the battery cell 102. In some embodiments the state of the battery cell 102 in combination with the present input to the mathematical model allows the model to predict the present output of the battery cell 102. States of a battery cell may for example include the state-of charge (e.g., for a lithium battery the degree of lithiation) or overpotentials. Parameters of the battery cell 102 typically vary more slowly over time than the states of the battery cell 102. Additionally, a parameter may not be required for the model to predict the present output of the battery cell 102. Instead knowledge of the parameters of battery cell, which may be called the state-of-health of the battery, relate to the long term functioning of the battery cell 102. Additionally, some embodiments include parameters which are not directly determinable from the measurement of the current battery cell 102 characteristics (e.g., volume fractions of active materials in the anode 120 and cathode 150, total cyclable lithium in the battery cell 102, electrolyte conductivity and radii of particles in the anode 120 and cathode 150).

A Moving Horizon Estimation (MHE) method is a model predictive estimator which can be used by a controller (e.g., a controller that operates as a battery management system) to solve an open-loop control problem by using the current states and parameters of the modeled system as the initial states of the modeled system at the next discrete time interval. Predictive estimators, such as the Moving Horizon Estimation (MHE) method, use a moving window of the most recent information and carry over the last estimate to the next time instant. Moving Horizon Estimation (MHE) uses a series of continuously sampled measurements over time to estimate the states and parameters of the system. The measurements may contain noise in addition to the measurement. The states, parameters, and noise may be estimated by solving the mathematical model within a set of constraints.

The MHE method seeks to minimize the difference (error) between the estimated value of the characteristic and the actual measured value of the characteristic over a series of discrete time measurements collected over a predetermined time horizon. That is, a cost function of the MHE method is composed of the deviation of the estimated output (e.g., an error between the measured characteristic and the estimated characteristic) from the measured output and an arrival cost that assumes a weight on the previously estimated states and parameters.

The arrival cost summarizes the effect of the previously measured and estimated data on the current estimation. For a linear unconstrained system or systems, a Kalman Filter covariance update formula can compute the arrival cost explicitly. However, a non-linear unconstrained system can be linearized at the currently estimated point and removing the constraints, and then the Kalman Filter can be employed to the approximated system. This application of the Kalman Filter to the approximated system is defined as an Extended Kalman Filter (EKF).

To apply the MHE method to the ROM dynamical system, a battery management system (e.g., the battery management system 180 as described above) can determine an arrival cost gain for each parameter based on its estimation robustness. The arrival cost gain may be modeled as time varying or time invariant. Additionally, the battery management system can characterize the effect of parameters identifiability in the estimation process and suspension of estimation under low excitation.

To determine an arrival cost gain for each parameter, the battery management system can use a Kalman Filter based method. In the implementation of the Kalman Filter based method in an arrival cost of the MHE method, the battery management system may assume that the probability density functions of the noises in states, parameters and output are shape invariant Gaussian distributions, that is, Gaussian distributions with time-invariant covariance matrices. However, battery cells undergo varying discharge, charge, and idle operations during relatively short time periods as the vehicle accelerates, decelerates, and stops during operation. From simulation and empirical data, different parameters and states of the Reduced Order Model (ROM) of Li-ion battery have different noise levels and different influence on the output and their noise and influence levels depend on the battery's state of operation. Accordingly, the battery management system may assume that the noise covariance matrix in estimation of states and parameters is a time-varying matrix that depends on the sensitivity of output on states and parameters at each horizon. Thus, the battery management system may employ different notions of states and parameters' sensitivity such as partial derivatives of output versus states and parameters and variations in the output over one drive cycle due to perturbation in states and parameters.

Additionally, the battery management system may also define a direct relation between noise covariance matrix and the sensitivity of output on parameters and states. The noise covariance matrix has an inverse relation with the arrival cost gains. For example, if the sensitivity of a parameter or state is gradually decreasing over a drive or charge cycle, then the entries in the noise covariance matrix associated with that parameter or state will also decrease which results in an increase in the associated arrival cost gain. If the arrival cost gain increases then the rate of change in that parameter or state during the prediction phase decreases and hence the parameter or state will have a higher tendency to retain its current value. The battery management system may use this inverse relationship to create an automatic estimation suspension mechanism which smoothly takes the focus away from the estimation of one or more parameters and/or states.

To identify states and parameters, the battery management system may employ various methods. For example, the battery management system suspends the estimation process, that is, the battery management system sets the parameters equal to the last identified values and predicted states according to the system dynamics under a low input persistency of excitation. In this example, the battery management system may define an input persistency of excitation to be an integration of a power gain of a current over the estimation time horizon. In another example, the battery management system may suspend the estimation of one or more parameters under low gradient of output or states function versus those parameters.

The Recursive Least Squares (RLS) estimation approximates a system as a linear model that is valid around a given operating point. In one example the operating point includes the observed states at the current time and the current estimation of the parameters. Various battery models, such as the Newman model based battery models include partial differential equations (PDEs) and/or differential algebraic equations (DAEs). The non-linear equations of the battery model are linearized versus the parameters to provide a linearized battery model representation. In certain embodiments this is accomplished by writing a set of linear equations that employ a logarithmic nonlinear transformation between the larger number of parameters appearing in the PDEs and the DAEs and the real parameters of the system that have physical meanings. In one embodiment linearization is achieved by using Taylor's series expansion of the nonlinear dynamical system of the ROM of the Newman Model versus the parameters.

In certain embodiments, the PDEs and DAEs of the battery model are linearized and written in a linear parametric model format, where the dot-product of a regressor vector and the set of parameters gives a scalar output. The regressor vector and the scalar output are functions of the monitored input and output of the system, observed states, and estimated parameters in a previous time step. According to the dynamics of ROM, we can employ high or low pass filters to the regressor vectors and the output of linear parametric model to increase the sensitivity of the system to the parameters being estimated.

The Recursive Least Squares (RLS) cost function includes a forgetting factor which decreases the contribution of older data relative to newer data. In some embodiments, a time varying forgetting factor can guarantee a constant cost of estimation and prevents the estimation gains from growing unboundedly.

The Recursive Least Squares (RLS) estimator minimizes the cost function related to the input signals and calculates adaptive gains for the parameters. In order to improve the sensitivity of the estimation a sensitivity covariance matrix may be generated that quantifies how highly two parameters or states are coupled over the dynamics of the system. Sensitivity coefficients are dependent on the time at which the output is measured. If these coefficients, that determine the relation between the output and parameters and states, are linearly independent, then there exists only one unique set of parameter values. On the other hand, if the linear dependence between these coefficients is represented by larger (closer to one) off-diagonal values in a sensitivity covariance matrix, those parameters or states may be unidentifiable. For such highly coupled parameters or states, we either estimate one entry in each highly coupled set or find a mathematical relation between them that has appeared in the dynamics of the system and estimate the combination as a new parameter or state.

Figure 2:
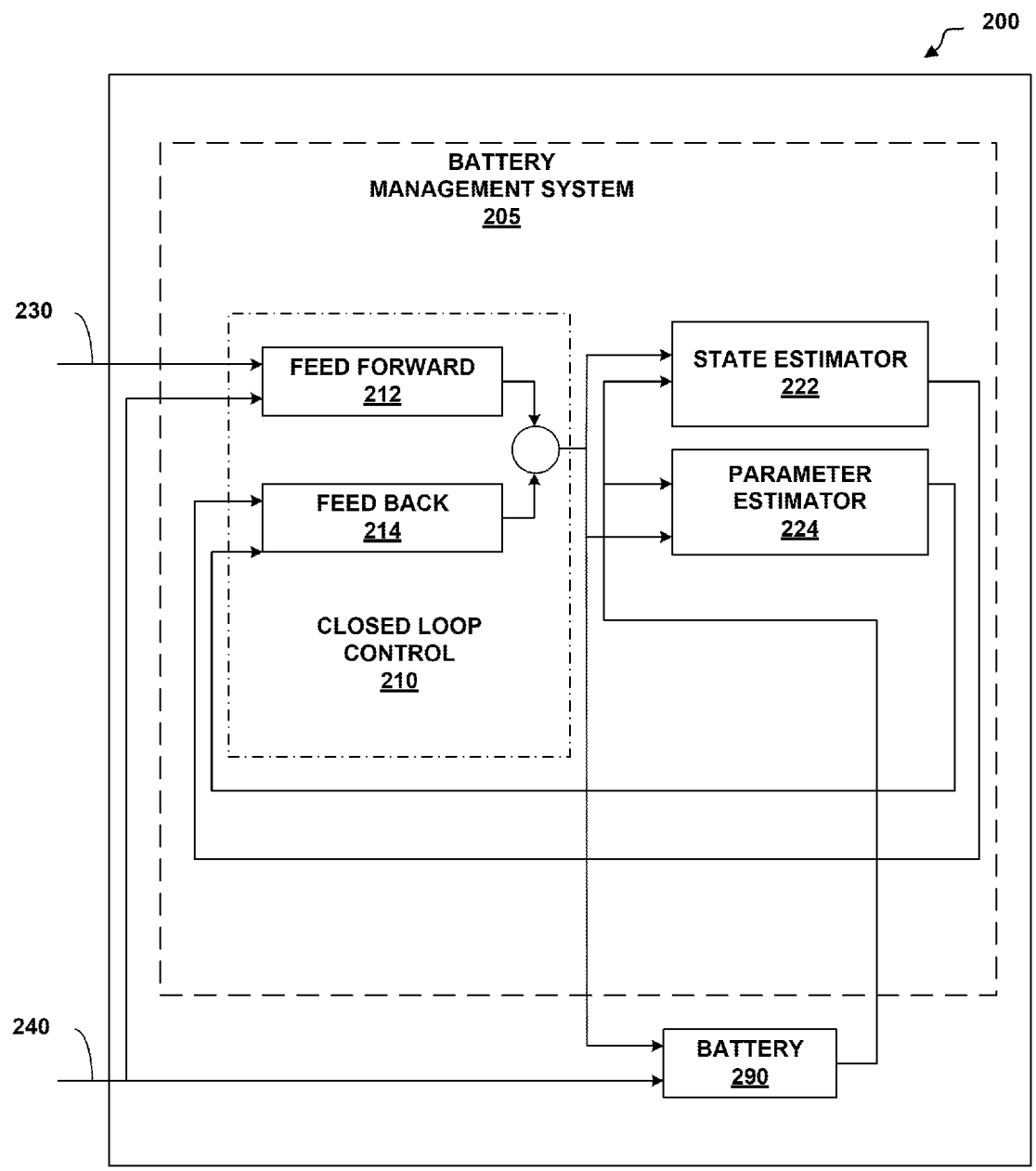
FIG. 2 is a functional block diagram of a battery system that applies a combined estimation structure to jointly esti

An embodiment of a battery system 200 is shown in FIG. 2. The battery system 200 includes a battery management system 205 that includes a closed loop control module 210, a state estimator 222 and a parameter estimator 224. The closed loop control module 210 includes a feedforward module 212 and a feedback module 214. The battery system 200 additionally includes a battery 290 which is in operable communication with the battery management system 205. In some embodiments the battery 290 may include one or more battery cells 102. The battery system 200 may be in operable communication with external sources of inputs to the battery system 200. A desired output 230 by an external source may be input to the battery management system 205. An open loop command 240 may also be applied to the battery system 200 via the battery management system 205 and/or directly to the battery 290.

The battery management system 205 may include the components previously described for the battery management system 180 of FIG. 1. Additionally, in certain embodiments of the battery system 200, the battery management system 205 includes a closed loop control module 210 which further includes a feedforward module 212 and a feedback module 214. The feedforward module 212 is in operable communication with a state estimator 222 and a parameter estimator 224 as well as with external sources which can provide as inputs various commands such as desired outputs 230 and/or open loop commands 240. The feedforward module 212 may provide at least one control signal to the battery 290. The feedforward module 212 may also provide at least one control signal to the state estimator 222 and/or the parameter estimator 224.

The feedback module 214 is in operable communication with the state estimator 222 and parameter estimator 224. The feedback module 214 receives the estimated states and parameters calculated by the state estimator 222 and/or parameter estimator 224 and may provide at least one control signal to the battery 290. The feedback module 214 may also provide at least one control signal to the state estimator 222 and/or parameter estimator 224.

The closed loop control module 210 includes both a feedforward module 212 and feedback module 214. The closed loop control module 210 may also include set points received from open loop sources, such as external sources. The closed loop control module 210 supplies at least one control signal based on the feedforward module 212 and feedback module 214. The feedforward component may be derived from a mathematical model, or from pre-determined set points. The feedback component is based on internal state and parameter estimates based on a physical model, such as from an electrochemical model of the battery 290. In some embodiments the battery management system 205 may include an open loop control module alone or in combination with the closed loop control module 210.

In the example of FIG. 2 the state estimator 222 and/or parameter estimator 224 may include an EKF-based estimator, a Moving Horizon based estimator, a Recursive Least Squares based estimator and combinations thereof that estimates the states and/or parameters of the battery 290. Dual estimation such as in the example of FIG. 2 (i.e., where states and parameters are estimated separately) may make the overall implementation less computationally intensive. The rate of change of the states of the battery system 200 is typically faster than the rate of change of the parameters of the battery system 200. In some embodiments, the frequency of updates of the parameters of the battery system 200 is less than the frequency of updates of the states of the battery system 200. In some embodiments the estimator used by the state estimator 222 is different from the estimator used by the parameter estimator 224. In certain embodiments the state estimator 222 includes the EKF-based estimator and the parameter estimator 224 includes the Moving Horizon based estimator and/or the Recursive Least Squares based estimator. In one embodiment the state estimator 222 includes the EKF-based estimator and the parameter estimator 224 includes the Moving Horizon based estimator. In another embodiment the state estimator 222 includes the EKF-based estimator and the parameter estimator 224 includes the Recursive Least Squares based estimator.

In some embodiments, the separation of state and parameter estimation into separate estimators 222 and 224 may allow one or both of the state estimator 222 and/or the parameter estimator 224 to be located remotely to the battery 290. In certain embodiments, the state estimator 222 and/or the parameter estimator 224 may be in operable communication with the other elements of the battery system 200 by wireless communication.

In the example of FIG. 2 the battery management system 205 regulates the charging or discharging of the one or more battery cells based on the estimation of the one or more states of the one or more battery cells. During charging, battery management system 205 implements one or more charging modes (e.g. substantially constant current, substantially constant voltage, substantially constant power, substantially constant change in voltage with respect to time (dV/dt), substantially constant change in voltage with respect to current (dV/dI)). By "substantially constant" it is meant a variation of less than about one percent around the median value. The battery management system 205 regulates the charging process such that the potential drop at the electrode-electrolyte interface at either the anode or cathode allows rapid charging without driving an overcharge side reaction (e.g., lithium deposition is thermodynamically favorable when the voltage at the interface is less than 0 volts relative to Li/Li$^+$). A continuously varying charge rate subject to the constraint of not driving an overcharge side reaction would provide rapid charging while preventing deleterious effects due to overcharging. The implementation of a continuously varying charge rate while preventing deleterious effects is computationally intensive.

In some embodiments, the battery management system 205 regulates the charging of the battery based on one or more estimated states by using a "staircase" of alternating charging modes (e.g., one of substantially constant current, substantially constant voltage, or substantially constant power) that approximately traces the boundary set by the constraint of preventing deleterious effects. In certain embodiments the battery management system 205 switches between a first charging mode and a second charging mode. For example, the battery management system 205 switches between substantially constant current and substantially constant voltage charging modes to approximate the charging path. In another example the battery management system 205 switches between substantially constant power and substantially constant current. In another embodiment, the battery management system 205 regulates the charging of the battery based on one or more estimated states by using at least three charging modes (e.g., selected from one of substantially constant current, substantially constant voltage, substantially constant power, substantially constant change in voltage with respect to time (dV/dt), or substantially constant change in voltage with respect to current (dV/dI)) that approximately traces the boundary set by the constraint of preventing deleterious effects. For example, the management system 205 switches between substantially constant power charging mode, substantially constant current charging mode, and substantially constant voltage charging mode.

In some embodiments, the battery management system 205 switches to the next charging mode in the charging sequence (e.g., from substantially constant current to substantially constant voltage, or vice versa) when internal states reach a threshold value. In some embodiments, there is a continuous transition between the charging modes (e.g., the voltage of the substantially constant current step is selected as the substantially constant voltage applied during the next step). In some embodiments, there can be a discontinuous transition between the charging modes (e.g., the substantially constant voltage could be higher or lower than the voltage at the end of the previous substantially constant current step). In certain embodiments, the battery management system 205 may regulate the charging of the battery 290 by transitioning from a substantially constant current step to a second substantially constant current step of higher or lower current. In certain embodiments, the battery management system 205 may regulate the charging of the battery 290 by transitioning from a substantially constant voltage step to a second substantially constant voltage step of higher or lower voltage. In certain embodiments, the battery management system 205 may regulate the charging of the battery by transitioning from a substantially constant power step to a second substantially constant power step of higher or lower power.

Various criteria may be used by the battery management system 205 to determine whether to switch charging modes (e.g., a predetermined length of time has passed, a predetermined amount of charge has been applied, the current falls to a predetermined value, a predetermined electrode-electrolyte potential drop is attained, a predetermined electrolyte or electrode concentration is obtained, a predetermined internal temperature is attained, and combinations thereof). In some embodiments, the battery management system 205 determines one or more criteria based on estimates received from the state estimator 222 and/or the parameter estimator 224.

The battery management system 205 may determine when charging is complete based on the battery model stored in the memory of the battery management system 205 and/or a diagnostic test. The battery management system 205 may use a coulomb counter and/or a diagnostic technique to determine whether to end the charging of the battery 290 once the battery 290 reaches a particular state of charge (e.g. fully charged). In one embodiment, the battery management system 205 may control the coulomb counter to track the state of charge of the battery 290 at all times (e.g., discharge periods, charge periods, rest periods) so that the charging process could be stopped once the battery 290 reaches a particular state of charge, or a particular cutoff voltage that corresponds to the desired state of charge.

In some embodiments, the battery management system 205 may adapt the charging sequence to account for changes in the battery 290 as the battery 290 ages. For example, as the properties of the battery 290 change over time, these changes can be reflected in the battery model of the battery 290 used by the battery management system 205 in the estimation and control algorithms of the battery 290. The parameter estimator 224 may be used to accurately estimate these parameters of the battery 290 as the parameters change over time.

Figure 3A:
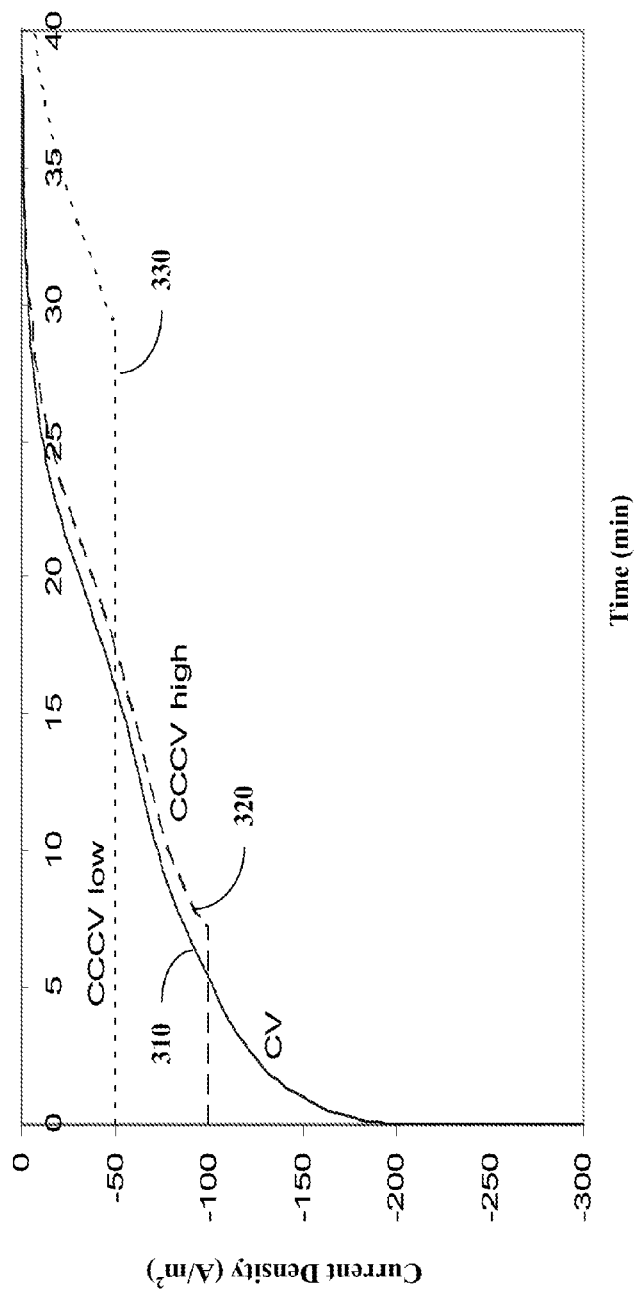
- FIG. 3A is an illustration of the current density versus time for comparative examples of conventional charging methods for a lithium battery charging methods applied to a lithium battery.
Figure 3B:
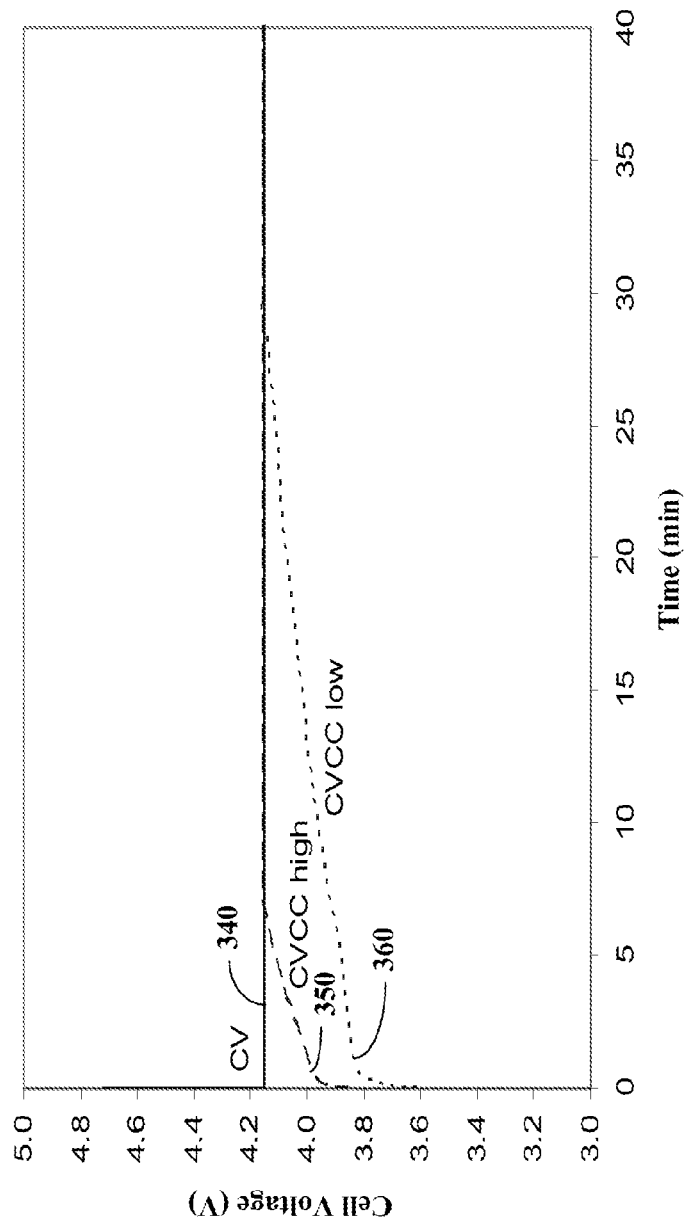
FIG. 3B is an illustration of the cell voltage versus time for comparative examples of conventional charging methods for a lithium battery charging methods applied to a lithium battery.
Figure 3C:
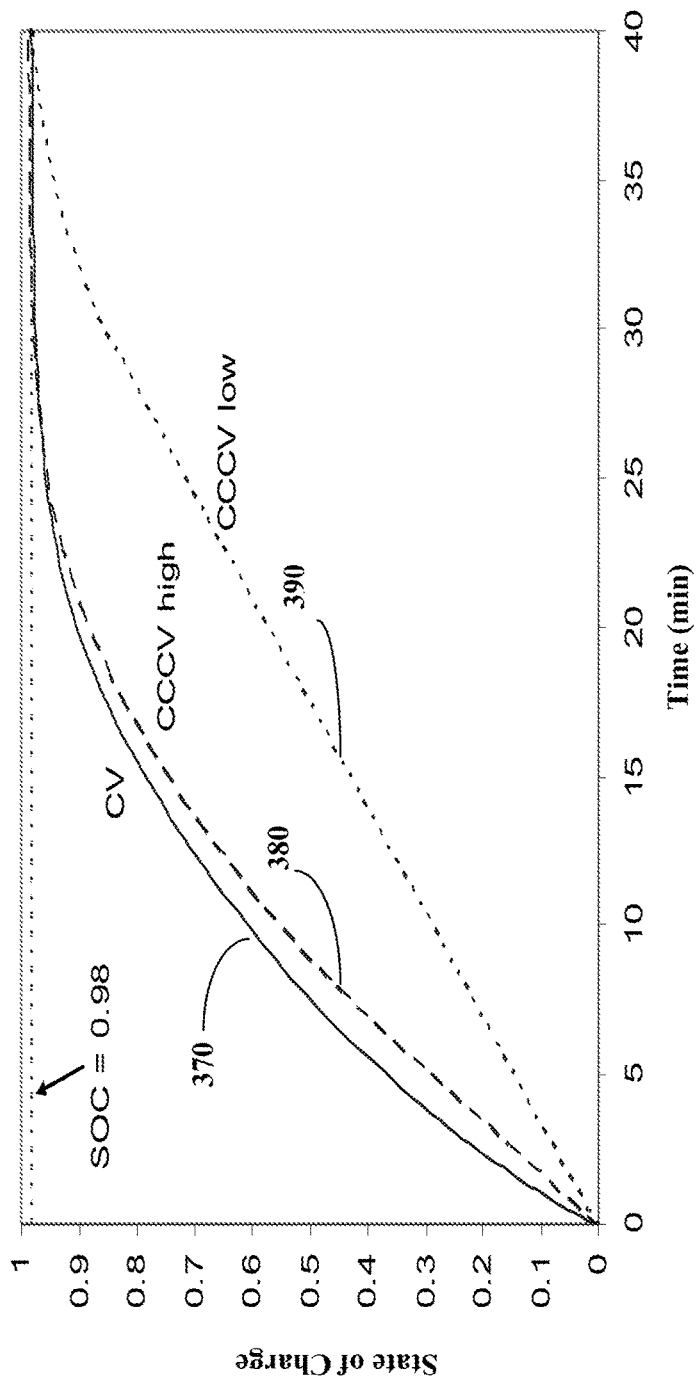
FIG. 3C is an illustration of the state of charge versus time for comparative examples of conventional charging methods for a lithium battery charging methods applied to a lithium battery.

FIGS. 3A, 3B, and 3C are comparative examples of charging methods for a lithium battery based on comparative examples of conventional charging methods for a lithium battery. The batteries represented in each of the comparative examples that are illustrated in FIGS. 3A, 3B, and 3C are the same. FIG. 3A illustrates the current density versus time for constant voltage (CV) charging 310, constant current-constant voltage high (CCCV) charging 320, and constant current-constant voltage low (CCCV) charging 330 of a lithium battery. FIG. 3B illustrates the cell voltage versus time for constant voltage (CV) charging 340 and constant voltage-constant current high (CVCC) charging 350 and constant voltage-constant current low (CVCC) charging 360 of a lithium battery. FIG. 3C illustrates the state of charge versus time for constant voltage (CV) charging 370 and constant current-constant voltage high (CCCV) charging 380 and constant current-constant voltage low (CCCV) charging 390 of a lithium battery.

In the example of FIG. 3A the constant voltage charging (CV) 310 and constant current-constant voltage (CCCV) high charging 320 both provide the battery (e.g., the battery 290) with about the same current density at about the same time along the charging path. The constant current-constant voltage (CCCV) low charging 330 results in lower current densities at the corresponding time along the charging path. Similar current densities result in similar amounts of charge being stored in the battery (e.g., the battery 290) at corresponding times along the charging path. In the example of FIG. 3B the constant voltage charging (CV) 340 and constant voltage-constant current (CVCC) high charging 350 both result in the battery potential reaching about the same value after about 6 to 7 minutes. The constant voltage-constant current (CVCC) low charging 360 results in slower charging of the battery (e.g., battery 290). The battery potential does not reach a substantially constant voltage until about 28 minutes. Similar cell voltages result in similar charging rates for the batteries. In the example of FIG. 3C, the time necessary to reach 98% state of charge (SOC) is about the same for both the constant voltage (CV) charging 370 and the constant current-constant voltage (CCCV) high charging 380. Both the constant voltage (CV) charging 370 and the constant current-constant voltage (CCCV) high charging 380 reach 98% state of charge in about 28 minutes. The constant current-constant voltage (CCCV) low charging 390 does not reach 98% state of charge until about 38 minutes. The conditions of charging a lithium battery by conventional techniques results in similar times necessary to reach a substantially fully charged state independent of the charging mode(s).

Figure 4:
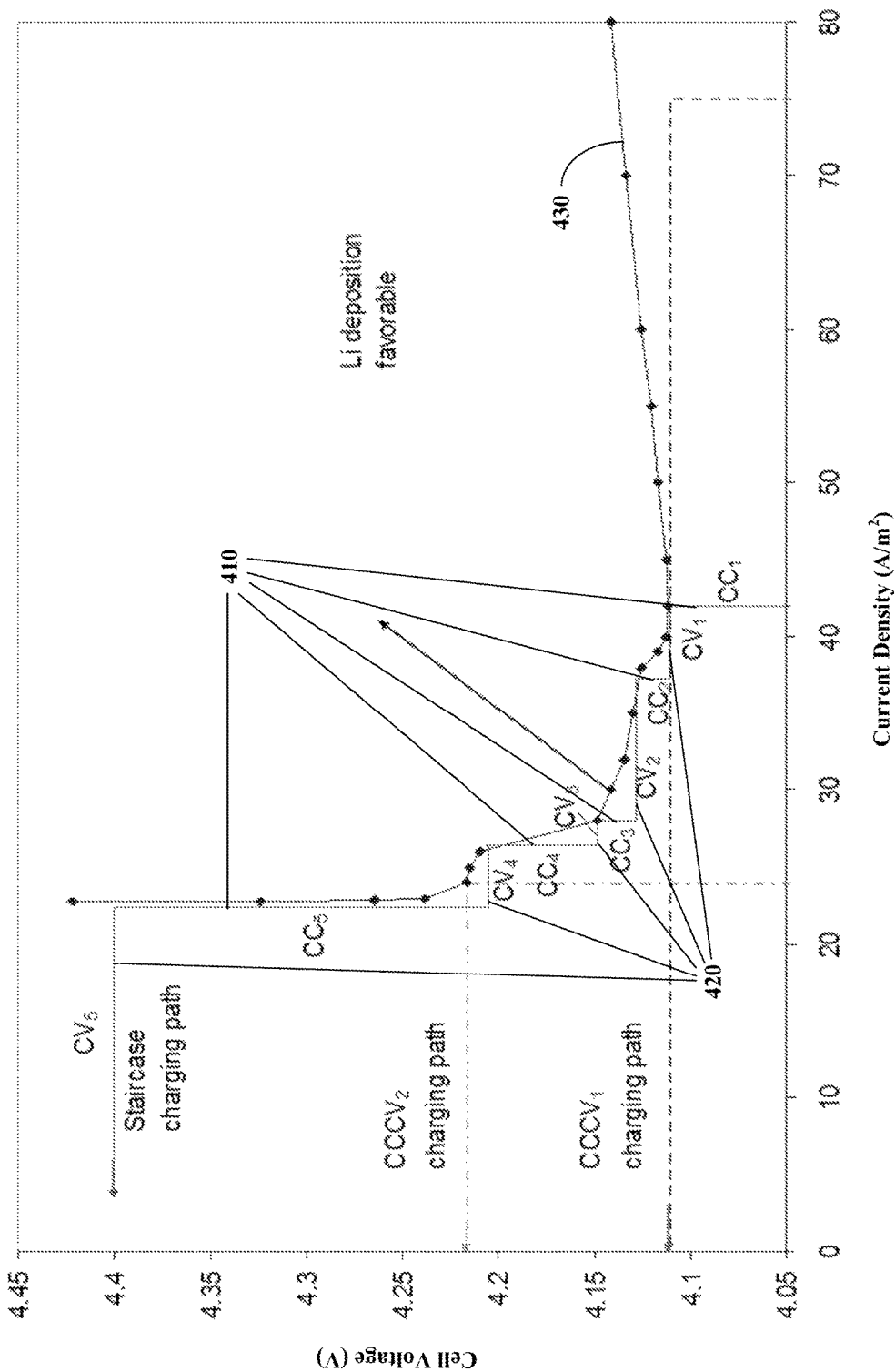
FIG. 4 is an illustration of the cell voltage versus current density for stepwise charging of a lithium battery in accordance with an embodiment.

FIG. 4 illustrates a stepwise charging of a lithium battery in accordance with some embodiments. A first charging mode 410, (e.g., constant current, $CC_1$, $CC_2$, $CC_3$, $CC_4$, $CC_5$), is initiated by the battery management system 205 until the cell voltage reaches a value determined by the battery management system 205 via the battery model and state estimator 222. The battery management system 205 then switches between the first charging mode 410 (e.g., $CC_1$, $CC_2$, $CC_3$, $CC_4$, $CC_5$) and a second charging mode 420, (e.g., constant voltage, $CV_1$, $CV_2$, $CV_3$, $CV_4$, $CV_5$) before conditions allowing deleterious side reactions are reached (e.g., lithium deposition). In the example, curve 430 represents the cell voltage at which lithium deposition is thermodynamically favorable, (e.g., less than 0 volts relative to $Li/Li^+$).

In the example of FIG. 4, additional criteria may be used by the battery management system 205 to determine whether to switch between a first charging mode 410 and a second charging mode 420 (e.g., an internal temperature exceeds a predetermined threshold, a cathode overpotential exceeds a predetermined threshold, the battery is charged to a predetermined capacity, and/or the battery is charged for a predetermined time). In some embodiments, the battery management system 205 may use the additional criteria to select the second charging mode (e.g., constant voltage to constant current, or constant power to constant current).

In the example of FIG. 4 the charging path is described as constant current as the first charging mode 410 and constant voltage as the second charging mode 420. It is understood that other combinations of the charging modes as described above may be used including constant voltage as the first charging mode and constant current as the second charging mode.

The example of FIG. 4 may further include a third charging mode (e.g., substantially constant power). The additional charging mode may be substituted for or used in combination with the first and/or second charging modes described above. Additionally, in some embodiments, the example may further include a fourth charging mode. In the fourth charging mode, the current is gradually decreased such that the slope dV/dI (change in voltage with respect to current) is substantially constant, thereby allowing a charging path that more closely follows the curve 430 in FIG. 4. The fourth charging mode may be implemented by regulating the resistance of a resistive element in series with the battery.

FIGS. 5A, 5B, 5C and 5D are examples of staircase charging profiles for a lithium battery. The battery of FIGS. 5A, 5B, 5C, and 5D is the same as the battery of FIG. 4. Comparative constant current-constant voltage charging ($CCCV_1$ 520 and $CCCV_2$ 530) is included in each of the examples 5A, 5B, 5C, and 5D. The constant voltage (CV) and constant current (CC) parameters were chosen such that the potential drop of interest falls to 0 V at some point during charging of the battery.

Figure 5A:
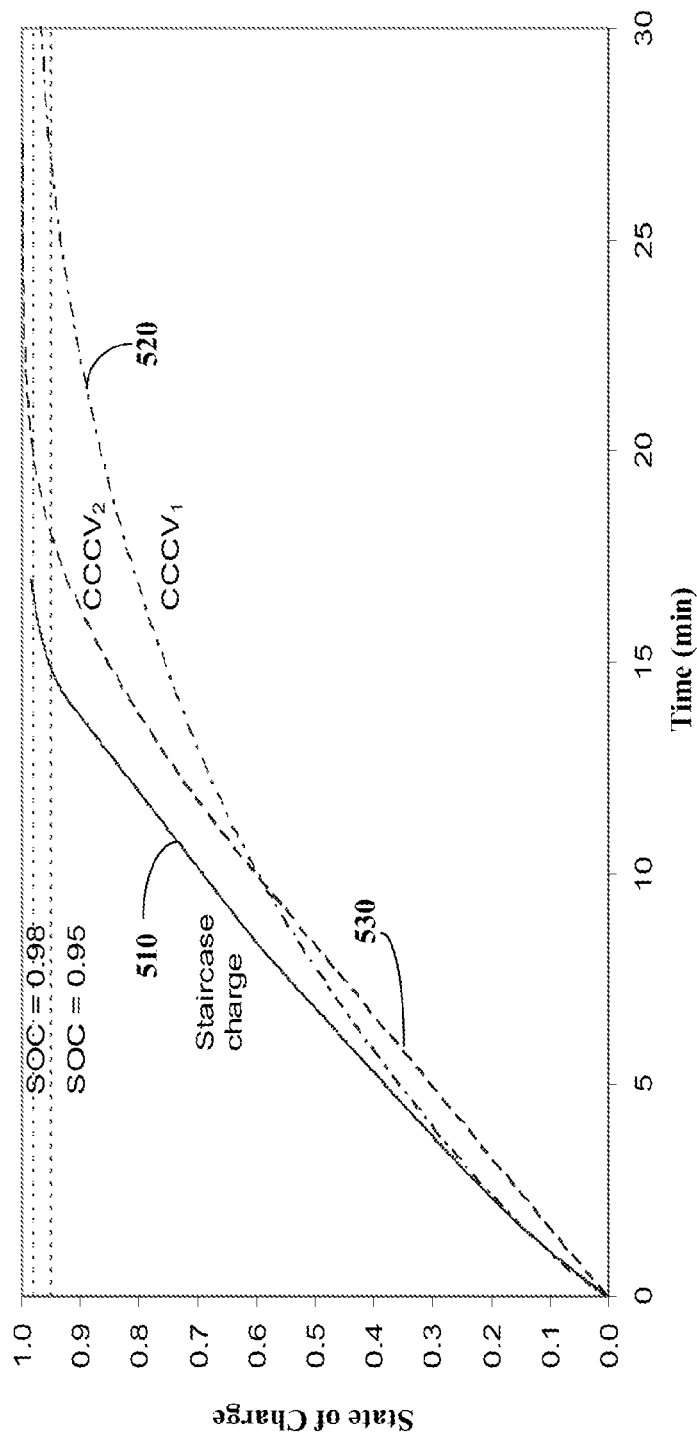
FIG. 5A is an illustration of the state of charge versus time for stepwise charging of a lithium battery in accordance with an embodiment.

FIG. 5A illustrates the state of charge of the batteries versus time of staircase charging 510 and comparative constant current-constant voltage charging ($CCCV_1$ 520 and $CCCV_2$ 530). The staircase charging 510 results in the battery having a greater state of charge during charging. Thus, illustrating that should charging of the batteries be interrupted prior to reaching a substantially fully charged state the amount of available power would be greatest for the battery charged via the staircase charging 510. The staircase charging 510 additionally resulted in the battery reaching a substantially fully charged state in about 17 minutes while the comparative constant current-constant voltage charging ($CCCV_1$ 520 and $CCCV_2$ 530) required over 30 minutes and about 20 minutes, respectively, to reach a substantially fully charged state.

Figure 5B:
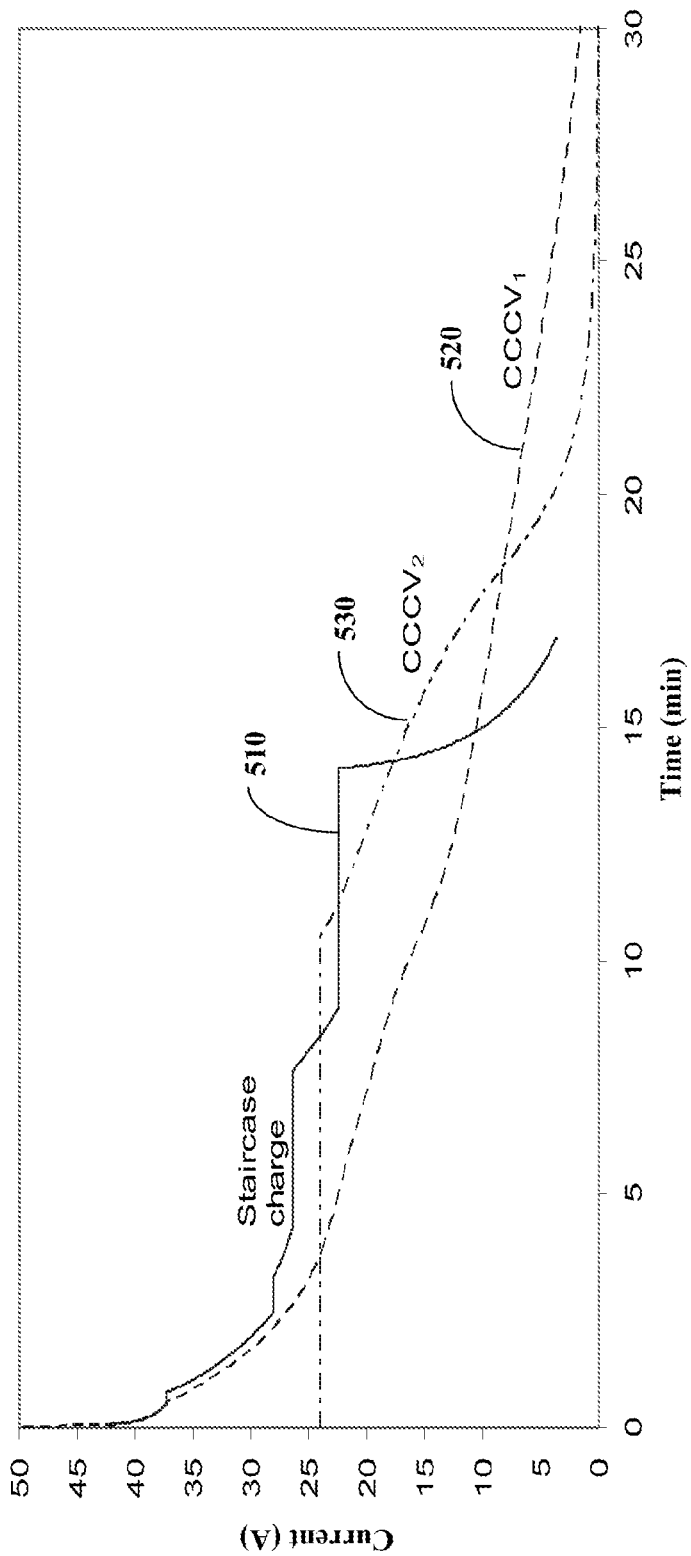
FIG. 5B is an illustration of the current versus time for stepwise charging of a lithium battery in accordance with an embodiment.
Figure 5C:
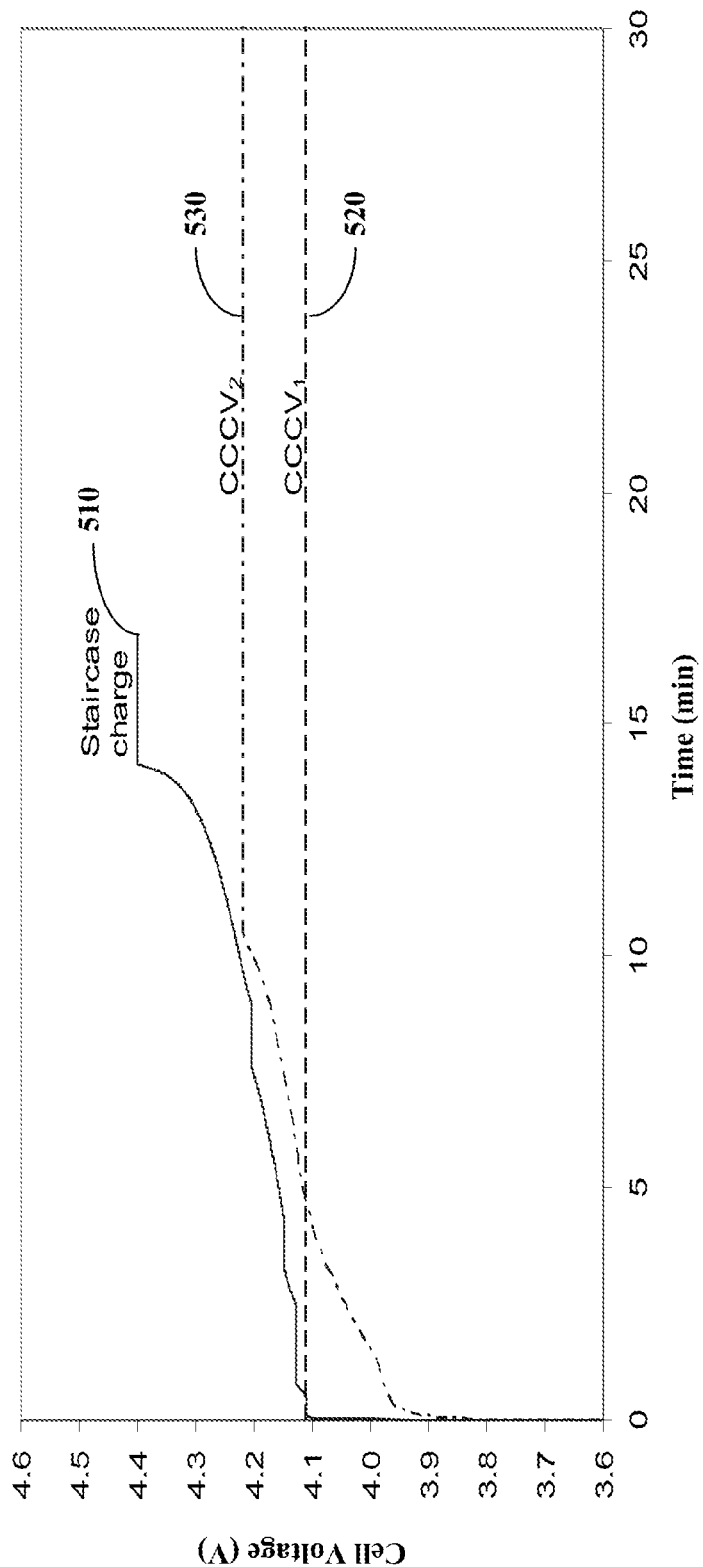
FIG. 5C is an illustration of the cell voltage versus time for stepwise charging of a lithium battery in accordance with an embodiment.

FIG. 5B illustrates the current versus time of staircase charging 510 and comparative constant current-constant voltage charging ($CCCV_1$ 520 and $CCCV_2$ 530) for the charge cycles illustrated in FIG. 5A. Similarly, FIG. 5C illustrates the cell voltage versus time of staircase charging 510 and comparative constant current-constant voltage charging (CCCV$_1$ 520 and CCCV$_2$ 530) for the charge cycles illustrated in FIG. 5A.

Figure 5D:
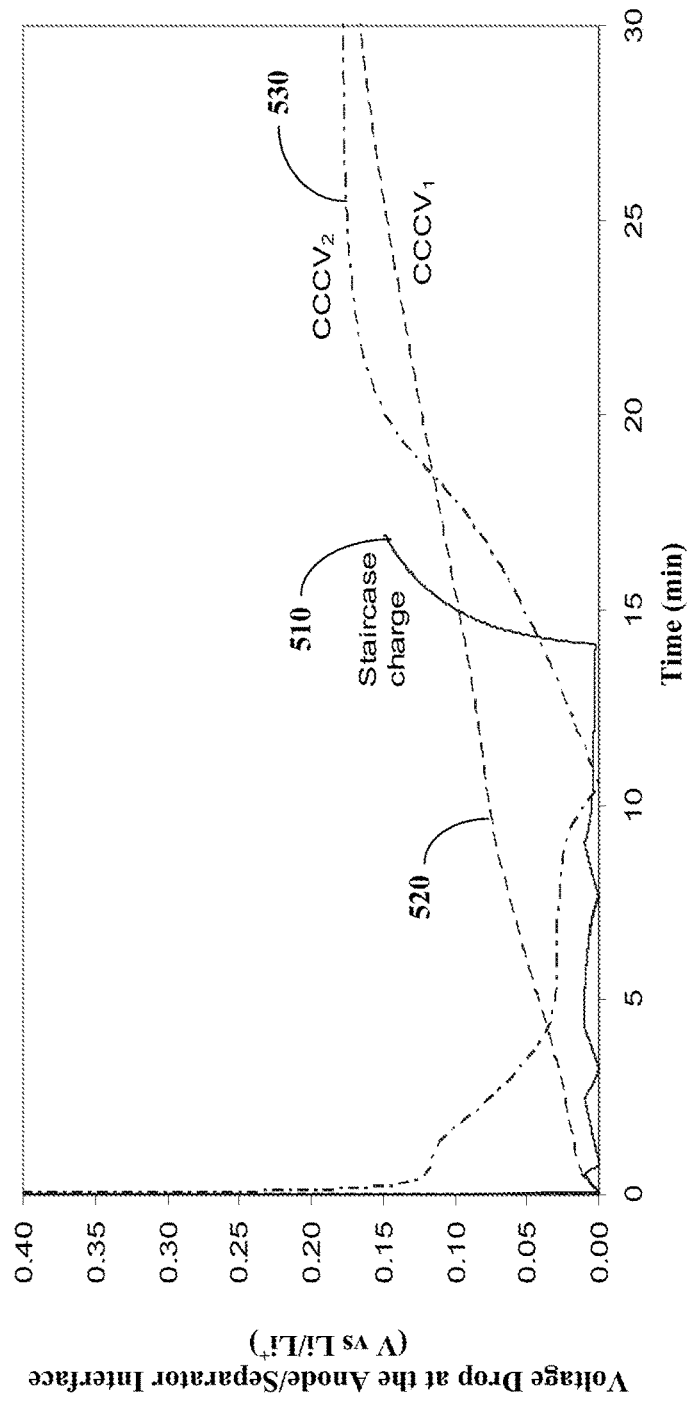
FIG. 5D is an illustration of the voltage drop at the separator/anode interface versus time for stepwise charging of a lithium battery in accordance with an embodiment.

FIG. 5D illustrates the voltage drop at the anode separator interface during charging. Deleterious processes may occur in the battery when the interfacial voltage is negative. The staircase charging 510 allowed the charging to be conducted under conditions closer to the boundary conditions in which deleterious effects (e.g., lithium deposition) can occur while still avoiding deleterious effects. Accordingly, the staircase charging 510 resulted in more rapid charging of the battery.

Figure 6:
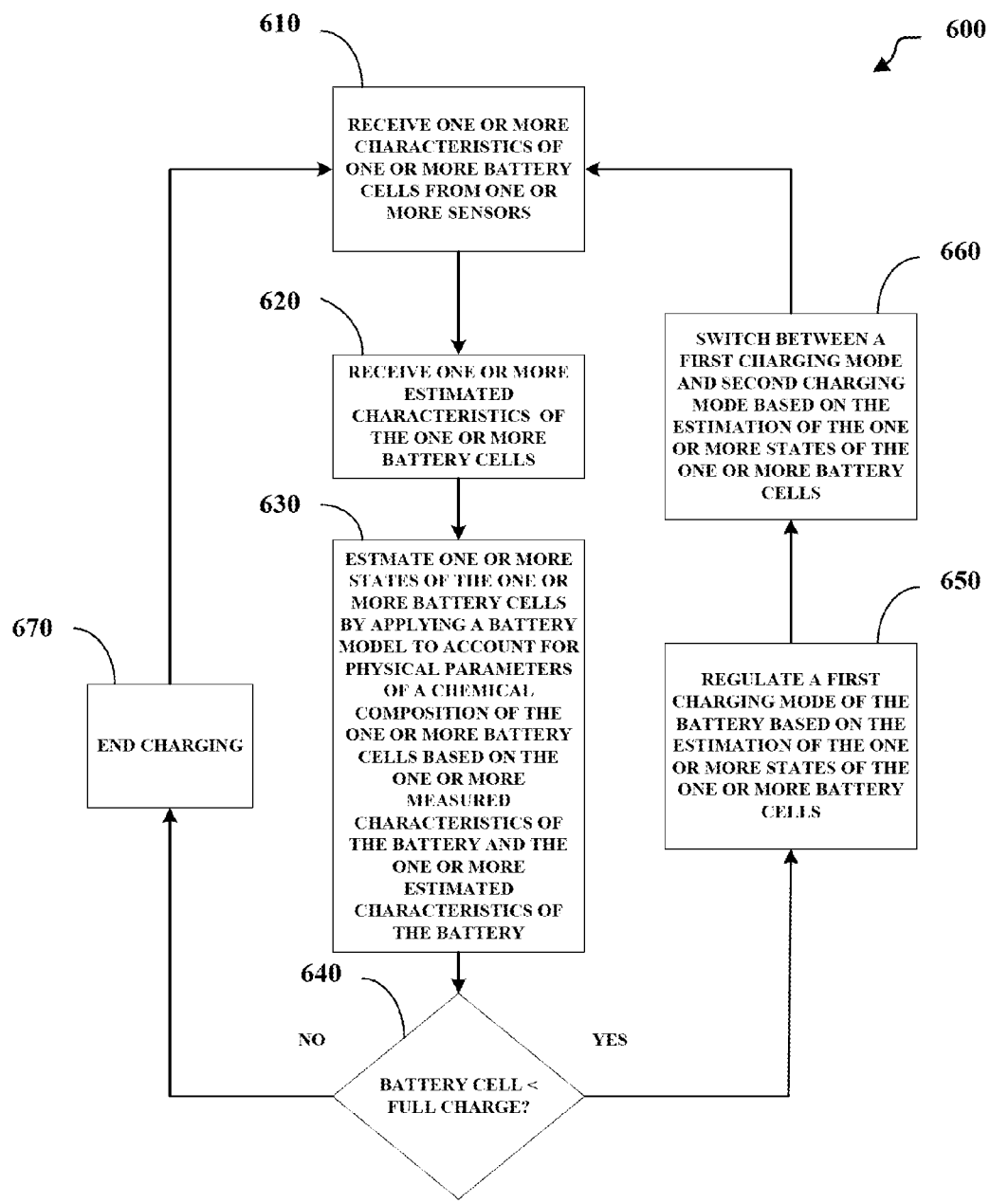
FIG. 6 is a flowchart of a method of providing rapid charging to a battery by stepwise switching of charging modes.

FIG. 6 is a flowchart of a method 600 of managing the charging of a battery system 100. In the example of FIG. 6, at block 610, the battery management system 180 receives data from one or more sensors of the sensing circuitry 170 which measure one or more characteristics of one or more battery cells 102. At block 620, the battery management system 180 receives one or more estimated characteristics of the one or more battery cells 102 from the state estimator 222 and/or parameter estimator 224. At block 630, the battery management system 180 estimates one or more states of the one or more battery cells 102 by applying a battery model to account for physical parameters of a chemical composition of the one or more battery cells 102 based on the one or more measured characteristics of the battery 290 and the one or more estimated characteristics of the battery 290. At block 640, the battery management system 180 determines whether the state of charge of the battery cell 102 is fully charged. If the battery cell 102 is not fully charged, at block 650, the battery management system 180 regulates the charging of the battery cell 102 in a first charging mode. At block 660, the battery management system 180 switches from the first charging mode to a second charging mode based on estimates from the state estimator 222 and/or parameter estimator 224. If the battery cell 102 is fully charged, at block 670, the battery management system 180 discontinues charging of the battery cell 102 (e.g., the battery is fully charged). In some embodiments, the battery model comprises an electrochemical-based battery model based on differential algebraic equations. In some embodiments, estimating, by the battery management system, one or more states of the one or more battery cells includes applying a Kalman filter, a Moving Horizon Estimation, or a Least Squares Estimation. In some embodiments, the battery model includes at least one of an electrochemical-based Reduced-Order-Model of a Newman model, an equivalent circuit model, or a single particle model. In some embodiments, the one or more states of the one or more battery cells includes a state-of-charge or a state-of-health of the one or more battery cells. In some embodiments, the first charging mode includes one of a substantially constant current, a substantially constant voltage, a substantially constant power, a substantially constant change in voltage with respect to time (dV/dt), or a substantially constant change in voltage with respect to current (dV/dI). In some embodiments, the second charging mode includes one of the substantially constant current, the substantially constant voltage, the substantially constant power, a substantially constant change in voltage with respect to time (dV/dt), or a substantially constant change in voltage with respect to current (dV/dI). In certain embodiments, the first charging mode includes the substantially constant current and the second charging mode includes the substantially constant voltage. In certain embodiments, the first charging mode includes the substantially constant voltage and the second charging mode includes the substantially constant power. In certain embodiments, the first charging mode includes the substantially constant current and the second charging mode includes the substantially constant power. In certain embodiments, the first charging mode includes the substantially constant current and the second charging mode includes the substantially constant change in voltage with respect to time (dV/dt). In certain embodiments, the first charging mode includes the substantially constant current and the second charging mode includes the substantially constant change in voltage with respect to current (dV/dI). In some embodiments, switching between the second charging mode and a third charging mode is based on the estimation of the one or more states of the one or more battery cells. In some embodiments, switching between the first charging mode and the second charging mode based on the estimation of the one or more states of the one or more battery cells occurs at a voltage greater than or equal to 0 volts relative to Li/Li$^+$.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the spirit and scope of this disclosure.

What is claimed is:

1. A method of managing a battery system, the battery system including one or more battery cells, one or more sensors coupled to the one or more battery cells and configured to measure one or more characteristics of the one or more battery cells, and a battery management system coupled to the one or more sensors and including a microprocessor and a memory, the method comprising:

receiving, by the battery management system, one or more measured characteristics of the one or more battery cells from the one or more sensors;

receiving, by the battery management system, one or more estimated characteristics of the one or more battery cells;

estimating, by the battery management system, one or more states of the one or more battery cells by applying a battery model to account for physical parameters of a chemical composition of the one or more battery cells based on the one or more measured characteristics of the battery and the one or more estimated characteristics of the battery;

regulating, by the battery management system, the charging of the one or more battery cells in a first charging mode of the battery based on the estimation of the one or more states of the one or more battery cells; and switching between the first charging mode and a second charging mode based on the estimation of the one or more states of the one or more battery cells, wherein the second charging mode is different from the first charging mode.

2. The method of claim 1, wherein the battery model comprises an electrochemical-based battery model based on differential algebraic equations.

3. The method of claim 2, wherein estimating, by the battery management system, one or more states of the one or more battery cells includes applying a Kalman filter, a Moving Horizon Estimation, or a Least Squares Estimation.

4. The method of claim 1, wherein the battery model includes at least one of an electrochemical-based Reduced- Order-Model of a Newman model, an equivalent circuit model, or a single particle model.

5. The method of claim 1, wherein the one or more states of the one or more battery cells includes a state-of-charge or a state-of-health of the one or more battery cells.

6. The method of claim 1, wherein the first charging mode includes one of a substantially constant current, a substantially constant voltage, a substantially constant power, a substantially constant change in voltage with respect to time (dV/dt), or a substantially constant change in voltage with respect to current (dV/dI).

7. The method of claim 6, wherein the second charging mode includes one of the substantially constant current, the substantially constant voltage, the substantially constant power, a substantially constant change in voltage with respect to time (dV/dt), or a substantially constant change in voltage with respect to current (dV/dI).

8. The method of claim 7, wherein the first charging mode includes the substantially constant current and the second charging mode includes the substantially constant voltage.

9. The method of claim 7, wherein the first charging mode includes the substantially constant voltage and the second charging mode includes the substantially constant power.

10. The method of claim 7, wherein the first charging mode includes the substantially constant current and the second charging mode includes the substantially constant power.

11. The method of claim 1, further comprising switching between the second charging mode and a third charging mode based on the estimation of the one or more states of the one or more battery cells.

12. The method of claim 1, wherein switching between the first charging mode and the second charging mode based on the estimation of the one or more states of the one or more battery cells occurs at a voltage greater than or equal to 0 volts relative to $Li/Li^+$.

13. A battery management system comprising a processor and a memory storing instructions that, when executed by the processor, cause the battery management system to:
receive one or more measured characteristics of one or more battery cells from one or more sensors, wherein the one or more battery cells and the one or more sensors are part of a battery system;
receive one or more estimated characteristics of the one or more battery cells from a battery model;
estimate one or more states of the one or more battery cells by applying a battery model to account for physical parameters of a chemical composition of the one or more battery cells based on the one or more measured characteristics of the battery and the one or more estimated characteristics of the battery;
regulate a first charging mode of the battery based on the estimation of the one or more states of the one or more battery cells; and
switch between the first charging mode and a second charging mode based on the estimation of the one or more states of the one or more battery cells, wherein the second charging mode is different from the first charging mode.

14. The battery management system of claim 13, wherein the battery model comprises an electrochemical-based battery model based on differential algebraic equations.

15. The battery management system of claim 14, wherein estimate one or more states of the one or more battery cells by applying the electrochemical-based battery model that applies differential algebraic equations to account for physical parameters of a chemical composition of the one or more battery cells includes applying a Kalman filter, a Moving Horizon Estimation, or a Least Squares Estimation.

16. The battery management system of claim 14, wherein the electrochemical-based battery model includes a Reduced-Order-Model of a Newman model.

17. The battery management system of claim 13, wherein the first charging mode includes a substantially constant current, a substantially constant voltage, a substantially constant power, a substantially constant change in voltage with respect to time (dV/dt), or a substantially constant change in voltage with respect to current (dV/dI);
the second charging mode includes a substantially constant current, a substantially constant voltage, a substantially constant power, a substantially constant change in voltage with respect to time (dV/dt), or a substantially constant change in voltage with respect to current (dV/dI); and
the second charging mode is different from the first charging mode.

18. The battery management system of claim 17, wherein the first charging mode includes the substantially constant current and the second charging mode includes the substantially constant power.

19. The battery management system of claim 17, wherein the first charging mode includes the substantially constant voltage and the second charging mode includes the substantially constant power.

20. The battery management system of claim 13, wherein switch between the first charging mode and the second charging mode based on the estimation of the one or more states of the one or more battery cells occurs at a voltage greater than or equal to 0 volts relative to $Li/Li^+$.

* * * * *